United States Patent [19]
Mikan

[11] Patent Number: 5,424,912
[45] Date of Patent: Jun. 13, 1995

[54] RACK-MOUNTED COMPUTER ACCESSORY INCLUDING PULL-OUT SHELF

[76] Inventor: Peter J. Mikan, 31 Greenfield Rd., Milford, Conn. 06460

[21] Appl. No.: 112,360

[22] Filed: Aug. 27, 1993

[51] Int. Cl.$^6$ .................. G06F 1/16; H05K 5/00; B43L 15/00
[52] U.S. Cl. .................. 361/680; 361/727; 248/118.5; 248/918; 400/715
[58] Field of Search ............ 248/500, 632, 118, 118.1, 248/118.5, 918; 211/151, 187, 69.1; 361/679, 680, 683, 725, 727, 825, 826, 829; 312/223.2, 223.3, 208.1; 364/708.1; 108/138, 143; 400/682, 715

[56] References Cited
U.S. PATENT DOCUMENTS
4,949,080  8/1990  Mikan .................. 345/161

OTHER PUBLICATIONS

Equip to Electronics Corporation Catalog #500-4, pp. A-4, A-5, A-10, A-11, A-44, and A-63, copyright 1990.
"Rittal P. C. Enclosure System", undated, 2 pages, Pull-Out Keyboard Drawer. Rittal Corporation, Springfield, Ohio.

Primary Examiner—Michael W. Phillips
Attorney, Agent, or Firm—H. Gibner Lehmann; Lehmann K. Gibner

[57] ABSTRACT

An accessory device for mounting manually operable equipment in a stacking type rack of the kind having vertically-spaced-apart front uprights. The device includes a shelf on which the equipment is supported, and extendable and retractable rail-type mounting devices secured to opposite sides of the shelf. Each rail-type mounting device is adapted for securement to one of the rack uprights to enable the shelf to be pulled forward from or pushed rearward into the rack. Clamping structures are carried by and supported by the shelf, for holding the manually operable equipment in a substantially fixed position with respect to the shelf. A hinged front panel on the shelf can swing between an upright position wherein it functions as a standard rack panel concealing the equipment, and a rearwardly-folded down position when the shelf is forwardly extended, wherein it provides actress to the equipment, and also constitutes a hand rest for the user of the equipment.

25 Claims, 3 Drawing Sheets

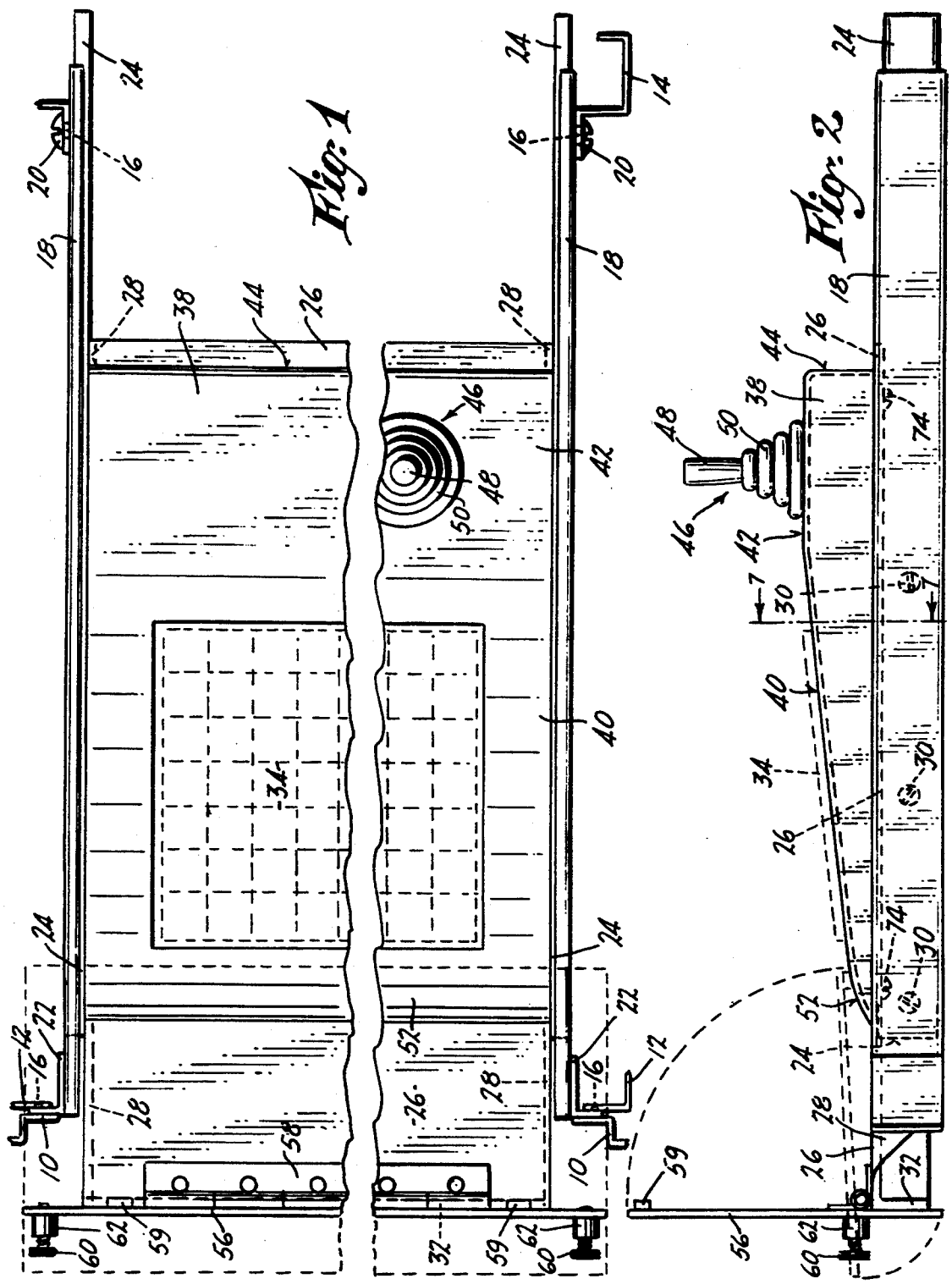

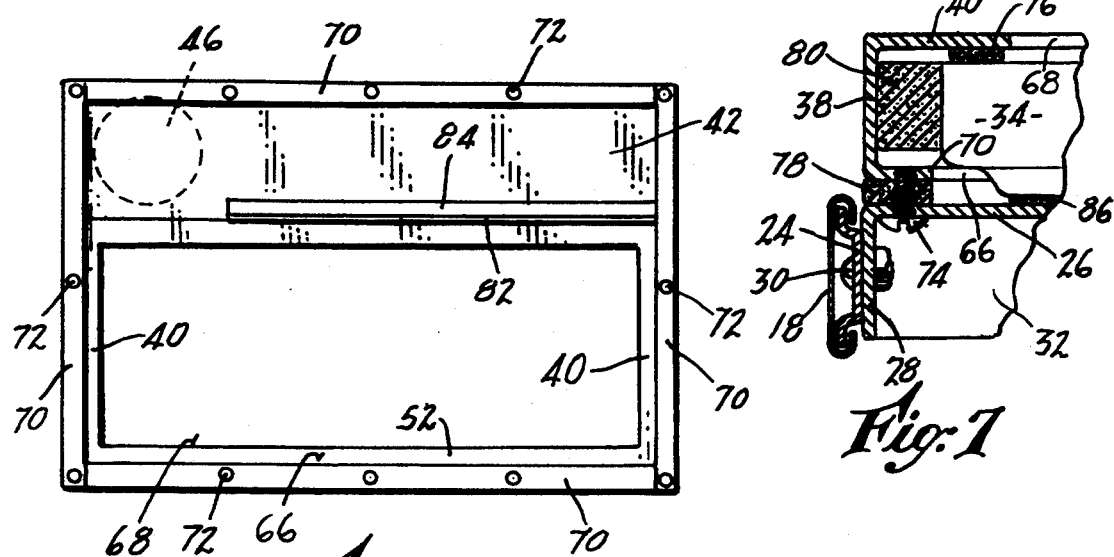

RACK-MOUNTED COMPUTER ACCESSORY INCLUDING PULL-OUT SHELF

Research and development of the present invention and application have not been Federally-sponsored, and no rights are given under any Federal program.

BACKGROUND OF THE INVENTION

FIELD OF THE INVENTION

This invention relates generally to rack-mounted computer equipment, and more particularly to a computer accessory device that is rack mounted.

DESCRIPTION OF THE RELATED ART INCLUDING INFORMATION DISCLOSED UNDER 37 CFR 1.97–1.98

One proposed design for a pull-out drawer for a computer keyboard is that of Rittal Corporation, as illustrated on page of the (undated) publication entitled "Rittal Handbook 27", by Rittal Corporation of Springfield, Ohio. The article is subtitled "Rittal PC Enclosure System". In this construction, the drawer is mounted in an upstanding cabinet of proprietary design, and the drawer has a hinged, fold-down front panel. The two uppermost pictures on this page illustrate the front panel in both its folded-down position and its upright position, wherein for the latter position the drawer can be pushed into the cabinet so as to conceal the keyboard.

In the disclosed design, the keyboard is merely laid in position on the floor or bottom of the drawer, and the weight of the keyboard is relied on to keep the unit from shifting within the drawer itself. If the cabinet is level, and if only moderate force is applied to the keyboard, this arrangement may be satisfactory for some applications.

With the wide availability of rack-systems for electronic equipment of all types, use of a standard 19" rack has become almost universal. The drawer-style mounting arrangement as proposed by Rittal is seen to be incompatible with racks per se. Clearly, their intent is for the customer to mount a large part of the equipment that is associated with the computer keyboard in the same customized cabinet.

In existing computer equipment storage facilities, particularly installations employing mostly rack-mounted equipment, there is often insufficient space to warrant substitution of a customized cabinet. Also, the expense of customized cabinets is often a consideration, as is the requirement to maintain flexibility if additional "stations" are contemplated, or if upgrading of the existing system to a higher level of sophistication is sought. This often involves either additional hardware, or substitution of new hardware which may or may not have physical configurations that are compatible with those of the original system. Dimensional considerations often have to be addressed during such upgrades, and where customized cabinets are used, conflicts due to incompatibility often arise in attempting to retrofit the new or upgraded equipment.

Accordingly, use of customized cabinets must be approached with some degree of caution, especially if equipment or system upgrades at a future date are planned.

Applicant's U.S. Pat. No. 4,949,080 illustrates an external housing for a keyboard console, wherein a joystick and several switches are mounted on the housing, and the console is clamped inside the housing by means of a bottom plate of the housing. The objective here was to join the keyboard console and joystick in a single unit, preferably without altering the keyboard console, so as to render operation of the joystick more convenient than would be the case if the joystick were disposed externally of the housing, as for example, loosely carried on one's desk or table.

The objective was successfully achieved in the patented construction. The patent does not, however, deal with rack-mounted equipment as such. The problems associated with housing of equipment in racks are somewhat different from those with equipment which is merely positioned on a table top, desk, etc., or on the floor.

The disclosure of applicant's U.S. Pat. No. 4,949,080 is hereby specifically incorporated by reference, into the present application.

SUMMARY OF THE INVENTION

The above disadvantages and drawbacks of prior computer accessory storage facilities are largely obviated by the present invention, which has for one object the provision of a novel and improved accessory device for mounting manually operable equipment in a stacking type rack, which device is both simple in its structure, and rugged and reliable in operation.

Another object of the invention is to provide an improved accessory device as above characterized, which is especially easy to use, and which provides a complete concealment of the equipment when not in use, and which is fully compatible with standard rack configurations, thus lending itself to ease of installation and adaptability to existing computer systems and equipment.

Still another object of the invention is to provide an improved accessory device of the kind indicated, which features an unusually reliable retention and mounting of the manually operable equipment, substantially without the need for any alteration to the physical structure of the equipment, thus preserving the same in its original condition, and thereby retaining rights to recovery under manufacturer's warranties and the like.

Yet another object of the invention is to provide an improved accessory device as above set forth, including provision for a cursor controller mounted integrally with a pullout shelf carried in a standard rack, thereby facilitating use of the controller, and ready integration of the same into the existing computer hardware with which the controller is utilized.

The above objects are accomplished by an accessory device for mounting manually operable equipment in a stacking type rack of the kind having vertically-spaced-apart front uprights provided with mounting apertures, the device comprising, in combination a shelf on which the equipment is to be supported, the shelf having depending flanges along its side edges and having a depending flange at its front edge. Extendable and retractable rail-type mounting devices are secured to the depending flanges of the shelf, each of the mounting devices being adapted for securement to one of the rack uprights by means of the mounting apertures thereof to enable the shelf to be pulled forward from or pushed rearward into the rack. A front panel is hingedly secured adjacent its bottom portion to the forward portion of the shelf, the front panel being swingable rearward from an upright substantially vertical position on the shelf to a rearwardly extending angular position on the shelf wherein it overlies forward portions of the shelf and exposes the depending flange at the front edge of the shelf. Handle means project from the front of the front panel, enabling the panel and the shelf to be pulled forward as a unit while being supported by the rail-type mounting devices on the rack.

The objects are further accomplished by an accessory device for mounting manually operable equipment in a stacking type rack of the kind having vertically-spaced-apart front uprights, the device comprising, in combination a shelf on which the equipment is to be supported, extendable and retractable rail-type mounting devices secured to opposite sides of the shelf, each of the mounting devices being adapted for securement to one of the rack uprights to enable the shelf to be pulled forward from or pushed rearward into the rack, and clamping means carried by and supported by the shelf, for holding the manually operable equipment in a substantially fixed position with respect to the shelf.

The arrangement is such that the manually operable equipment, as for example, a keyboard console, is firmly retained in a fixed position on the shelf, and the shelf and equipment can be readily accessed from the front by virtue of the fold-down front panel. The latter functions as a hand rest, as well as a (blank) rack panel that conceals the equipment during storage, and prevents both access thereto and exposure to environmental influences, such as water, pilled or splashed chemicals, airborne debris and the like.

Other features and advantages will hereinafter appear.

BRIEF DESCRIPTION OF THE DRAWINGS

In the drawings, illustrating a preferred embodiment of the invention:

FIG. 1 is a top plan view of a rack mounting framework and rack housing therefor, the latter being shown in fragmentary section. On the rack mounting framework there is an accessory device in the form of a pull-out shelf having a fold-down front panel that doubles as a standard rack panel when the shelf is retracted, and a fold-down hand rest when the shelf is pulled forwardly of the rack frame. The solid outline position of the front panel corresponds to a retracted position of the shelf, whereas the dotted outline position corresponds to a forwardly extended position of the shelf and where the panel has been folded rearwardly, providing access to the equipment, and also providing a hand rest for the user of the equipment.

FIG. 2 is a right side elevation of the accessory device of FIG. 1, the solid outline position of the panel corresponding to a retracted position of the shelf, and the dotted outline position corresponding to a forwardly extended position of the shelf and where the panel has been folded rearwardly.

FIG. 6 is a bottom plan view of a clamping housing portion of the accessory, and FIG. 7 is a fragmentary section taken on the line 7—7 of FIG. 2.

DESCRIPTION OF THE PREFERRED EMBODIMENT

Figure 3:
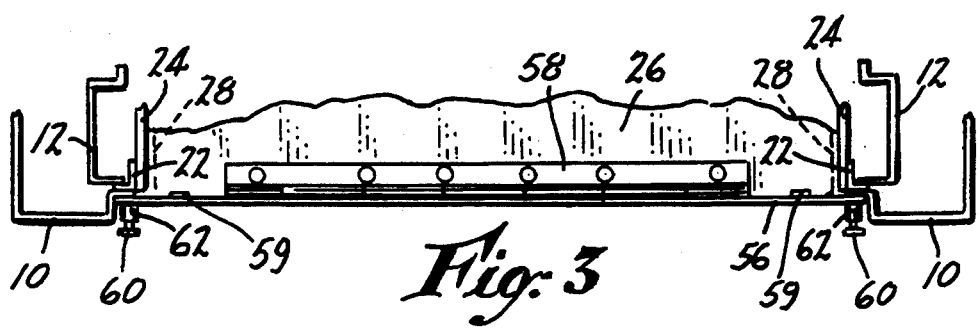
FIG. 3 is a fragmentary top plan view of the rack mounting framework and housing of FIG. 1, showing the shelf disposed in a fully retracted position, and the front panel occupying a position in front of the rack framework and being secured thereto by screws, so as to conceal the equipment in the rack framework and housing.
Figure 4:
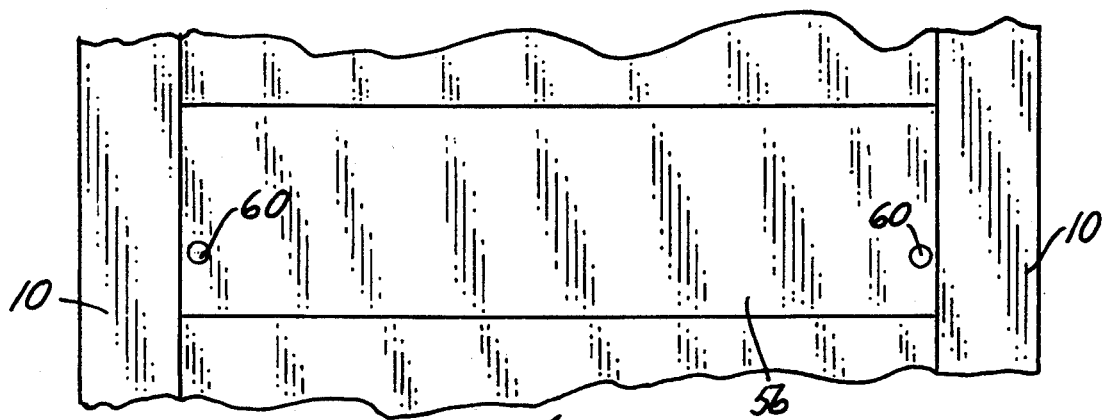
FIG. 4 is a fragmentary front elevation of the rack mounting framework and housing, and front panel of FIG. 3.
Figure 5:
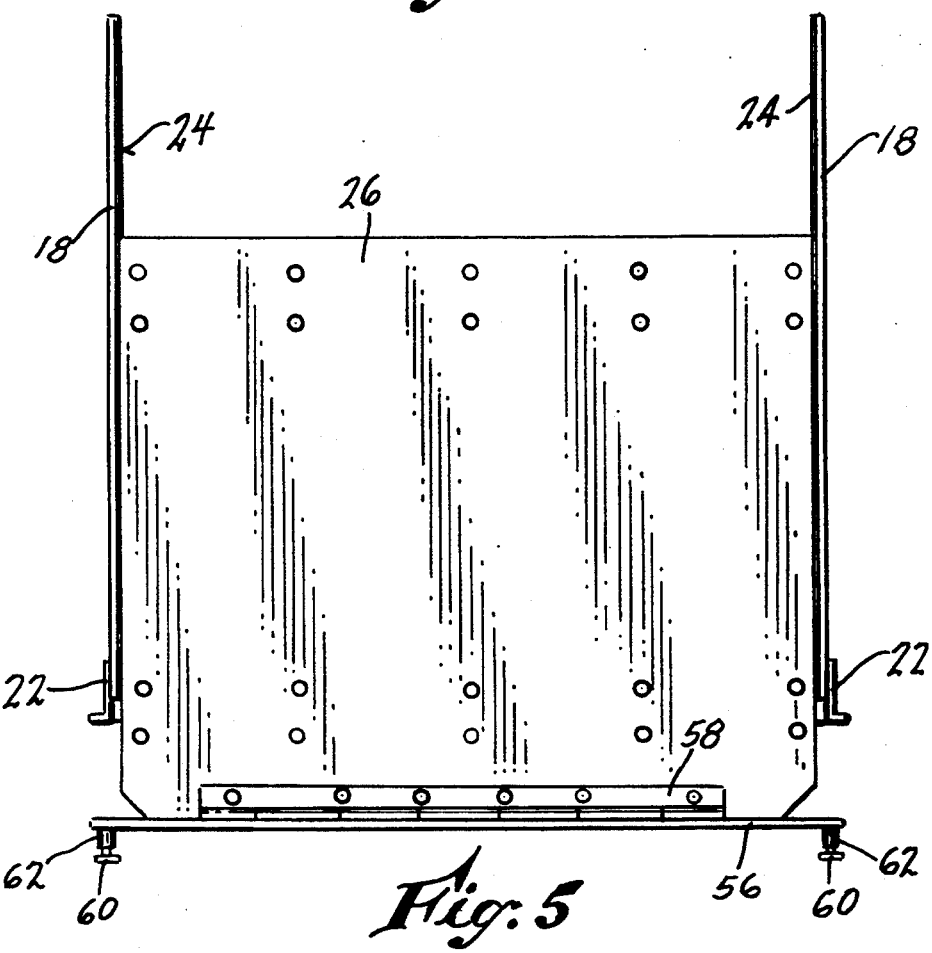
FIG. 5 is a bottom plan view of the shelf and the rails secured thereto and which support the shelf in the rack mounting framework.

Referring to FIGS. 1, 3 and 4, there is illustrated a rack framework or assembly of generally conventional construction and of the type currently used for mounting a wide variety of electronic and/or electromechanical equipment, the assembly comprising an upstanding rack housing 10 in which are carried angular-cross-section front and rear rack uprights 12 and 14 respectively, provided with series of vertically spaced holes 16. Secured to the uprights 12 and 14 are slide-rail assemblages comprising formed sheet metal tracks 18 that are attached to the rack uprights 12, 14 by suitable screws 20 and mounting brackets 22. The tracks 18 carry slider rails 24 which can extend forward from the positions shown, to jut out from the front of the rack housing 10.

In accordance with the present invention there is provided, for use with rack assemblies of the kind above described, a novel and improved accessory device for mounting manually-operable equipment such as computer keyboards especially, or electronic or mechanical gear comprising solid state circuitry, mechanical drives, trackball or joystick components and the like, by which such equipment can be readily made accessible for convenient operation, or else stored away in orderly fashion in the rack assembly for use at a later time.

In the preferred embodiment of the invention illustrated herein, the novel accessory device comprises a mechanically sturdy shelf member 26 preferably constituted of 1/8" sheet metal, having oppositely disposed depending side flanges 28 which are bolted to the slider rails 24 by screws 30. The shelf 26 at its front portion extends forwardly of the front ends of the slider rails 24 an appreciable distance, as seen in FIGS. 1 and 2, and has a front depending flange 32 which imparts added rigidity to the shelf.

Mounted on the shelf 26 is a keyboard console 34, being held by a clamping housing 38 having a sloped top portion 40 merging with a level rear portion 42 which has a depending rear vertical wall 44. On the rear portion 42 there is mounted an X-Y lever control 46 having a hand lever 48 extending through a rubber boot 50. The front edge portion 52 of the clamping housing 38 curves downward, as seen in FIG. 2.

The keyboard console 34 can be of conventional design, comprising a plastic keyboard casing constituting the console enclosure, and having the usual keys accessible through a bezel portion of the console 34.

It will be seen that with such arrangement the assemblage of the shelf 26 and keyboard console 34 together with the slider rails 24 constitute a rigid and sturdy unit which can be slid forward to extend forwardly of the rack housing 10 by a considerable distance for providing access to the keyboard 34 and lever control 46, or else slid backward into the rack housing 10 to be completely enclosed thereby. The considerable length of the slider rails 24 prevents any tendency for them to bind in the rail tracks 18 whereby the extending and retracting movement of the keyboard console 34, clamping housing 38 and shelf 26 as a unit, can be easily and readily accomplished. At the same time, the construction is extremely sturdy due to the thickness of the shelf 26 and the flanged configuration of the same.

The slide rails can be located conveniently at the desired height in the cabinet 10, since the rack uprights 12 and 14 have the multiple, vertically disposed mounting holes 16 to accommodate attachment of the fixed rail components or tracks 18.

Further in accordance with the present invention a unique front panel assemblage is provided which not only functions as a cover plate to enclose the space above the keyboard console 34 but also as an arm rest or hand rest for the use of the operator who is using the keyboard console. Such assemblage comprises a relatively thick, flat rectangular metal panel 56 which can advantageously be constituted of 1/8" thick aluminum, secured adjacent its bottom portion to the forward portion of the shelf 26 by an elongate piano hinge 58 which enables the panel 56 to be swingable from a forward upright position as seen in FIGS. 1 and 2 to a rearwardly extending angular position as indicated by the dotted line showing in FIG. 2. In this rearwardly extending position, the panel 56 is spaced above the shelf 26 and is substantially parallel therewith. The upright forward position of the panel 56 enables it to constitute a closure or rack panel blank for the opening or gap in the rack framework and housing, when the accessory of the invention is retracted and enclosed by the rack framework and housing. When the accessory is extended forward, projecting from the front of the rack framework and housing, the panel 56 is swung backward and downward so that its uppermost portion rests on the forward curved section 52 of the keyboard housing 38. A cushioning pad 59 is provided on the under or inner side of the panel 56. In such rearward position, the panel 56 constitutes a convenient arm or hand rest for the user, thereby facilitating the actuation of the keyboard and also the control lever 46.

When the panel 52 is in raised position, closing the opening in the rack assembly, it can be secured by thumb screws 60 turnably carried in posts 62 that are attached to the panel. Such posts not only provide a secure mounting for the screws 60 but also serve as convenient handles to enable the accessory to be pulled forward from its storage position, when it is to be placed in use. The screws 60 will thread into the holes 16 in the rack uprights 12.

In accordance with the present invention, the assemblage of the shelf 26, keyboard console 34 and housing 38 embraces a novel and improved combination which results in a unique clamping of the keyboard console 34, to hold the latter in a substantially fixed position on the shelf 26. The upper portion of this unique clamping means comprises the sheet metal housing 38 which, in the disclosed embodiment, mostly surrounds the keyboard console 34, and which is fixedly carried on the shelf 26, being secured thereto by screws 74. The clamping housing 38 has an open bottom 66 (FIG. 6) through which the keyboard console 34 can be inserted prior to the housing being secured to the shelf 26. The open bottom 66 of this housing 38 is sufficiently large to generously receive the keyboard console 34, FIGS. 6 and 7. The housing 38 also has a window 68 through which the keys of the keyboard console 34 extend, and can be accessed.

FIGS. 6 and 7 show further details of the novel clamping means. Bordering the bottom opening 66 is a rectangular inturned flange 70 which has mounting apertures 72 that can either be threaded, or else carry threaded nuts (not shown) to receive screws 74, as in FIG. 7.

Also in accordance with the invention, there is provided a resilient means disposed between the clamping housing 38 and the keyboard console 34, in the form of a rubber strip or gasket 76. This strip can extend around the periphery of the window 68 in the clamping housing 38, being disposed on the housing's inner surface, as in FIG. 7. In addition, a second resilient strip or gasket 78 is provided, disposed between the shelf 26 and the inturned flange 70 of the housing 38, as in FIG. 7. The mounting screws 74 extend through holes in this strip 78. Again, strips such as that indicated at 78 can be positioned around the periphery of the bottom opening 66, FIG. 6, in the manner of FIG. 7. The screws 74, when tightened, pull up the clamping housing against the shelf 26, and both the gaskets 76 and gaskets 78 undergo a limited compression as this is done. As a consequence, the keyboard console 34 is resiliently clamped in position in the manner of FIG. 7, between the shelf 26 and the clamping housing 38. Inadvertent shifting of the keyboard console 34 with respect to either the clamping housing 38 or the shelf 26, is thereby prevented, by the invention.

Also, by the invention, a pair of bumper strips 80, FIG. 7, can be provided, engageable with the sides of the clamping housing 38 and disposed between the housing sides and the sides of the keyboard console 34. The bumper strips 80 serve to centralize the keyboard console 34 in the clamping housing 38.

FIG. 6 illustrates an internal positioning shoulder 82 in the clamping housing 38, which is engageable by the keyboard console 34, and which shoulder 82 prevents shifting of the console 34 in the clamping housing. The shoulder is in the form of an angle piece 84, welded or otherwise secured in place, as in FIG. 6.

The disclosed arrangement, constituting a keyboard storage facility, provides a finished appearance to the keyboard console 34 and clamping housing 38, since the latter appears, at first glance, to be a part of the keyboard console 34 itself, but in fact, is not. Instead, as noted above, it overlies the keyboard console 34 and clamps the latter in position on the shelf 26.

Further by the invention the clamping housing 38 conveniently disposes the X-Y cursor controller comprising the joystick or manually-operable actuator lever 48 in an accessible location. Thus, in addition to the keyboard console 34 being held rigid on the shelf 26, the base of the controller 46 is similarly held rigid with the console 34 and shelf 26, which has the advantage that manual operation of the actuator lever 48 is greatly facilitated, since the base will not inadvertently shift during manual actuation of the lever 48. Such would not be the case if the controller 46 were merely placed in a position on top of the shelf 26 without some type of securement thereto. Thus, this feature is considered to be an important aspect of the present invention.

In a preferred construction, the keyboard console 34 is provided with mounting feet, one of which is shown in FIG. 7 and indicated 86. Under such circumstances, tightening of the screws 74 pulls the housing against the upper surface of the keyboard console 34, which in turn causes compression of the console's feet 86, and firm engagement of such feet with the upper surface of the shelf 26. Where such feet are rubber, an enhanced retention of the console 34 against sliding is realized. Also, the rubber feet will function to compensate for slight dimensional variations in the various parts, and prevent crushing of the case of the keyboard console 34 when the screws 74 are pulled up.

In place of the joystick type controller illustrated, another type of manually operable cursor controller could be employed, such as a track ball, swivel key, touch pad, or the equivalent.

With the disclosed arrangement, there is had the important advantage that the keyboard console 34 which is utilized can be securely mounted in position on the pull-out shelf 26, without any modification to the casing of the keyboard console 34, and without the need for any drilling of this casing or other type of permanent alteration thereto. As a consequence, there are minimized potential problems with inadvertent damage to the console 34, since during installation and use, it is not physically altered, even though it is clamped in a fixed position on the shelf 26. The chance of malfunction is reduced, as are problems with possible voiding of a manufacturer's warranty on the keyboard console 34, as from alteration of the console cabinet, alleged misuse of the console, and the like.

From the above it can be seen that I have provided a novel and improved accessory which is both convenient to use, and rugged and reliable in use. The accessory is readily adaptable to existing installations employing either standard 19" rack frameworks, substantially without modification, or other rack-type installations of conventional design.

The accessory provides positive clamping action of the manually operable equipment, thereby facilitating its ease of use. The unique hide-away design provided by the hinged front panel, assures both full access to the equipment when in use, and effective concealment and protection of the equipment when not in use, the panel in such case, functioning as a standard rack panel having the external appearance of a blank.

The disclosed device is thus seen to represent a distinct advance and improvement in the field of rack-mounted computer equipment.

Variations and modifications are possible without departing from the spirit of the invention.

Each and every one of the appended claims defines an aspect of the invention which is separate and distinct from all others, and accordingly it is intended that each claim be treated in this manner when examined in the light of the prior art devices in any determination of novelty or validity.

What is claimed is:

1. An accessory device for mounting manually operable equipment in a stacking type rack of the kind having vertically-spaced-apart front uprights provided with mounting apertures, said device comprising, in combination:
    a) a shelf on which said equipment is to be supported, said shelf having depending flanges along its side edges and having a front edge and a depending flange at its front edge, said shelf having a forward portion,
    b) extendable and retractable rail-type mounting devices secured to the depending flanges of said shelf, each said mounting device being adapted for securement to one of said rack uprights by means of the mounting apertures thereof to enable the said shelf to be pulled forward from or pushed rearward into said rack, said shelf thereby constituting a pull-out shelf,
    c) a front panel having a bottom portion, said front panel being hingedly secured adjacent its bottom portion to the forward portion of said shelf, said front panel being swingable rearward from an upright substantially vertical position on the shelf to a rearwardly extending angular position on the shelf wherein it overlies forward portions of the shelf and exposes the said depending flange at the front edge of the shelf,
    d) handle means projecting forwardly from the front of said front panel, enabling the panel and the said shelf to be pulled forward as a unit while being supported by said rail-type mounting devices on the rack, and
    e) clamping means carried and supported by said pull-out shelf at the upper surface thereof, for clamping the manually operable equipment in a substantially fixed position against the shelf.

2. An accessory device as set forth in claim 1, in combination with:
    a) a keyboard constituting the said manually operable equipment,
    b) said keyboard having front portions spaced rearward from the front edge of said pull-out shelf whereby the keyboard front portions are accessible from above,
    c) said front panel when in its rearwardly extending angular position being disposed over the accessible front portions of the pull-out shelf and constituting a hand rest for a person using the keyboard.

3. An accessory device as set forth in claim 2, wherein:
    a) said front panel when in its rearwardly extending position is spaced above the pull-out shelf and substantially parallel therewith.

4. An accessory device as set forth in claim 2, in combination with:
    a) rack means constituting the said stacking type rack, and
    b) bolts securing the rail-type mounting devices to the said front uprights of the rack means.

5. An accessory device and keyboard as set forth in claim 2, and further including:
    a) an upstanding cursor control lever carried above said pull-out shelf, 6. An accessory device and keyboard as set forth in claim 2, wherein:
    a) said shelf constitutes a bottom support for the said keyboard.
    b) said front panel having a height wherein its top edge lies in a horizontal plane which is above the uppermost portion of the said control lever.

7. An accessory device and keyboard as set forth in claim 6, wherein:
    a) said shelf extends forwardly beyond the front portions of the keyboard.

8. An accessory device as set forth in claim 1, wherein:
    a) said handle means comprises screws passing through the said front panel, said screws being adapted to pass into selected ones of the apertures in the uprights of the stacking-type rack.

9. An accessory device as set forth in claim 1, wherein:
    a) said handle means comprises hollow posts projecting from the front panel, and
    b) screws carried by said posts, extending rearward through the front panel and adapted for insertion into selected ones of the apertures in the uprights of the stacking-type rack.

10. An accessory device as set forth in claim 1, wherein:

a) a piano-type hinge is provided, for hingedly connecting the front panel to the said shelf.

11. The invention as set forth in claim 1, and further including:
a) thumb screws carried by said handle means, for securing said front panel, when it is disposed in its vertical position, to said spaced-apart front uprights of the rack at corresponding mounting apertures thereof.

12. In a stacking type rack of the kind having vertically-spaced-apart front uprights, in combination:
a) manually operable equipment comprising a computer keyboard, and a shelf on which said keyboard is supported,
b) extendable and retractable rail-type mounting devices secured to opposite sides of said shelf, each said mounting device being adapted for securement to one of said rack uprights to enable the said shelf to be pulled forward from or pushed rearward into said rack, thereby constituting a pull-out shelf and
c) clamping means carried by and supported by said pull-out shelf, for holding said keyboard in a substantially fixed position on the pull-out shelf,
d) said keyboard having multiple manually engageable keys,
e) said clamping means comprising a housing having a window, and having an opening sufficiently large to permit insertion of said keyboard through said opening, the keys of the keyboard being accessible through said window when the keyboard is installed in the housing, and
f) means fixedly mounting said housing to said pull-out shelf so as to clamp said keyboard against said pull-out shelf.

13. The invention as set forth in claim 11, wherein:
a) said housing has an apertured mounting flange adjacent its opening, and
b) fasteners extending through the apertures of the mounting flange and being connected to said pull-out shelf.

14. The invention as set forth in claim 13 wherein:
a) said pull-out shelf has a plurality of mounting holes, and
b) said fasteners comprising screws inserted through the mounting holes in the pull-out shelf and being received in the apertures of the mounting flange of the housing.

15. The invention as set forth in claim 12, and further including:
a) a periphery around the window of the housing and a resilient liner disposed between the periphery and the keyboard, and constituting a cushion therebetween.

16. The invention as set forth in claim 12, and further including:
a) a resilient liner disposed between the side walls of the housing and the keyboard, and constituting a cushion therebetween.

17. The invention as set forth in claim 12, and further including:
a) a resilient liner disposed between the housing and the shelf, and constituting a cushion therebetween.

18. The invention as set forth in claim 12, and further including:
a) resilient means interposed between said housing and said keyboard, biasing the keyboard in a direction toward the pullout shelf.

19. The invention as set forth in claim 12, wherein:
a) said housing has an internal positioning shoulder engageable with said keyboard, for restraining the latter against lateral movement in said housing.

20. The invention as set forth in claim 12, and further including:
a) a manually engageable cursor control device, substantially fixedly carried by the housing and retained against lateral shifting with respect to said housing and said pull-out shelf.

21. The invention as set forth in claim 20, wherein:
a) said cursor control device comprises a joystick controller mounted on the housing, said joystick controller having a moveable joystick actuator lever, and said joystick controller being held in a fixed position with respect to both the keyboard and the pull-out shelf.

22. The invention as set forth in claim 12, wherein:
a) said keyboard is sandwiched between and substantially rigidly held in place by said housing and said pull-out shelf.

23. A keyboard storage facility, comprising in combination:
a) a rack framework and housing,
b) a pull-out shelf member slidably carried in said rack framework and housing, said pull-out shelf member being extendable from and retractable in said rack framework, said pull-out shelf member having an upper support surface,
c) a keyboard console having manually engageable keys, and having resilient mounting feet on the side opposite to the keys, and
d) clamping means fastened to the pull-out shelf member and overlying portions of the keyboard console, said clamping means having a window through which the keys of the keyboard console can be accessed, said clamping means pressing the resilient feet of the keyboard console against the upper support surface of the pull-out shelf member so as to compress said feet, to retain the keyboard console in position on said pull-out shelf member surface, and restrain the keyboard console against inadvertent shifting thereon.

24. The invention as set forth in claim 23, and further including:
a) a cursor controller device, and
b) said clamping means comprising means mounting said cursor controller device in a substantially fixed position with respect to the keyboard console, thereby to restrain the cursor controller device against inadvertent lateral shifting with respect to the pull-out shelf member.

25. The invention as set forth in claim 24, wherein:
a) said cursor controller device comprises a joystick.

* * * * *